(12) United States Patent
Lin et al.

(10) Patent No.: US 12,740,214 B2
(45) Date of Patent: Sep. 15, 2026

(54) DISPLAY MODULE AND METHOD FOR MANUFACTURING DISPLAY MODULE

(71) Applicants: Wuhan Xinxiang Optoelectronics Technology Co., Ltd., Wuhan (CN); Hudei Xinying Optoelectronics Co., Ltd., Ezhou (CN)

(72) Inventors: Yuanbin Lin, Wuhan (CN); Hao Li, Wuhan (CN); Bibo Li, Wuhan (CN)

( * ) Notice: Subject to any disclaimer, the term of this patent is extended or adjusted under 35 U.S.C. 154(b) by 436 days.

(21) Appl. No.: 18/380,972

(22) Filed: Oct. 17, 2023

(65) Prior Publication Data

US 2024/0128422 A1 Apr. 18, 2024

(30) Foreign Application Priority Data

Oct. 18, 2022 (CN) ......................... 202211272063.3

(51) Int. Cl.
*H01L 21/68* (2006.01)
*H10H 20/857* (2025.01)
(Continued)

(52) U.S. Cl.
CPC .......... *H10H 20/857* (2025.01); *H10W 90/00* (2026.01); *H10H 20/0364* (2025.01)

(58) Field of Classification Search
CPC .............. H10H 20/857; H10H 20/0364; H01L 25/0753; G09F 9/33
(Continued)

(56) References Cited

U.S. PATENT DOCUMENTS 10,763,415 B2 * 9/2020 Jeon ..................... H10H 20/856
11,545,472 B2 * 1/2023 Guo ..................... G09G 3/3233
(Continued)

FOREIGN PATENT DOCUMENTS

CN 106711136 A 5/2017
CN 106898601 A 6/2017
(Continued)

OTHER PUBLICATIONS

European Patent Office, English abstract for CN106711136A, printed on Oct. 25, 2023.
(Continued)

*Primary Examiner* — Vu A Vu
(74) *Attorney, Agent, or Firm* — Cahn & Samuels, LLP

(57) ABSTRACT

A display module includes a substrate, a plurality of pixel units are arrayed on the substrate, and each of the pixel units is provided with at least three light-emitting chips, and the centers of at least three light-emitting chips are not collinear; and the projections of at least three light-emitting chips along a first direction at least partially overlap, and the projections of at least three light-emitting chips along a second direction at least partially overlap where the first direction is perpendicular to the second direction. In at least one embodiment, there is a method for manufacturing the display module, since the centers of the light-emitting chips are not collinear, that is, a plurality of light-emitting chips are not arranged in a straight line, and the projections of the plurality of the light-emitting chips partially overlap in at least two directions, the positions of the plurality of the light-emitting chips are more concentrated, which can effectively improve the light emission effect of the light-emitting chips.

7 Claims, 8 Drawing Sheets

(51) Int. Cl.
*H10W 90/00* (2026.01)
*H10H 20/01* (2025.01)

(58) Field of Classification Search
USPC ........................................................ 257/91
See application file for complete search history.

(56) References Cited

U.S. PATENT DOCUMENTS

| | | | | |
|---|---|---|---|---|
| 11,895,888 | B2 * | 2/2024 | Xu | H10K 59/1213 |
| 11,943,986 | B2 * | 3/2024 | Lou | H10K 59/353 |
| 12,185,584 | B2 * | 12/2024 | Wang | H10K 59/1213 |
| 12,205,976 | B2 * | 1/2025 | Lou | H10H 20/835 |
| 2009/0191669 | A1 * | 7/2009 | Peng | H01L 21/568<br>438/119 |
| 2010/0181582 | A1 * | 7/2010 | Li | H10H 20/853<br>257/E33.056 |
| 2015/0077645 | A1 * | 3/2015 | Lin | H04N 9/3129<br>349/9 |
| 2018/0233492 | A1 * | 8/2018 | Liu | H10H 20/857 |
| 2023/0180551 | A1 * | 6/2023 | Lu | H10K 59/1201<br>257/91 |

FOREIGN PATENT DOCUMENTS

| | | | |
|---|---|---|---|
| CN | 206505686 | U | 9/2017 |
| CN | 107516664 | A | 12/2017 |
| CN | 108230928 | A | 6/2018 |
| CN | 108807356 | A | 11/2018 |
| CN | 109244102 | A | 1/2019 |
| CN | 208970508 | U | 6/2019 |
| CN | 110416386 | A | 11/2019 |
| CN | 110600492 | A | 12/2019 |
| CN | 112599459 | A | 4/2021 |
| CN | 113675305 | A | 11/2021 |
| CN | 216213439 | U | 4/2022 |
| CN | 114447189 | A | 5/2022 |
| CN | 114551686 | A | 5/2022 |

OTHER PUBLICATIONS

European Patent Office, English abstract for CN10751666A, printed on Oct. 25, 2023.
European Patent Office, English abstract for CN108230928A, printed on Oct. 25, 2023.
European Patent Office, English abstract for CN108807356A, printed on Oct. 25, 2023.
European Patent Office, English abstract for CN109244102A, printed on Oct. 25, 2023.
European Patent Office, English abstract for CN110416386A, printed on Oct. 25, 2023.
European Patent Office, English abstract for CN110600492A, printed on Oct. 25, 2023.
European Patent Office, English abstract for CN112599459A, printed on Oct. 25, 2023.
European Patent Office, English abstract for CN113675305A, printed on Oct. 25, 2023.
European Patent Office, English abstract for CN114447189A, printed on Oct. 25, 2023.
European Patent Office, English abstract for CN114551686A, printed on Oct. 25, 2023.
European Patent Office, English abstract for CN206505686U, printed on Oct. 25, 2023.
European Patent Office, English abstract for CN208970508U, printed on Oct. 25, 2023.
European Patent Office, English abstract for CN216213439U, printed on Oct. 25, 2023.
European Patent Office, English abstract for CN106898601A, printed on Oct. 25, 2023.
China National Intellectual Property Administration, Search Report for CN 2022112720633, Nov. 22, 2022, pp. 1-4.
China National Intellectual Property Administration, Office Action for CN 202211272063.3, Nov. 30, 2022, pp. 1-6.

* cited by examiner

DISPLAY MODULE AND METHOD FOR MANUFACTURING DISPLAY MODULE

This patent application is a Paris Convention application claiming priority to China Patent Application No. CN 2022112720633 filed on Oct. 18, 2022, which is hereby incorporated by reference.

I. FIELD OF THE INVENTION

The present invention relates to the field of display technology, and, in particular, to a display module and a method for manufacturing the display module.

II. BACKGROUND OF THE INVENTION

With the rapid development of LED technology, applications of LED are becoming more and more widespread, and people have higher demands on LED technology.

In related technology, the current arrangement of flip-chip lamp bead chips is generally a horizontal or vertical in-line arrangement, with red light chips, green light chips, and blue light chips placed in scattered positions and with significant differences in light emission angles, resulting in impure display effects of the module, especially in small pitch products.

Therefore, it is necessary to propose a new display module and a method for manufacturing the display module to overcome the above-mentioned problems.

III. SUMMARY OF THE INVENTION

The embodiments of the present invention provide a display module and a manufacturing method of the display module so as to solve the problem in the related art that chips are placed in scattered positions and light emission angles are also greatly different, resulting in impure display effects of the module.

In a first aspect, a display module is provided, comprising: a substrate, a plurality of pixel units are arrayed on the substrate, and each of the pixel units is provided with at least three light-emitting chips, and centers of at least three light-emitting chips are not collinear; and projections of at least three light-emitting chips along a first direction at least partially overlap, and projections of at least three light-emitting chips along a second direction at least partially overlap, wherein the first direction is perpendicular to the second direction.

In some embodiments, each of the pixel units is provided with three light-emitting chips, and lines connecting the centers of the three light-emitting chips form an acute-angled triangle.

In some embodiments, one side of the substrate is provided with at least one common A-pole pad and a plurality of B-pole pads in each of the pixel units, the A-poles of at least three light-emitting chips are electrically connected to the common A-pole pad, and the B-poles of the light-emitting chips are respectively electrically connected to the corresponding B-pole pads, wherein polarities of the A-poles and the B-poles are opposite; and the other side of the substrate is provided with a common pin in each of the pixel units, and the common pin is electrically connected to the common A-pole pad.

In some embodiments, a surface of the substrate is covered with exposure dissolving glue, the exposure dissolving glue forms grooves on surfaces of the light-emitting chips, the grooves are filled with colloids, and colors of the colloids are basically the same as that of the exposure dissolving glue.

In some embodiments, the surfaces of the exposure dissolving glue and the colloids are covered with optical glue, and the surface of the optical glue is covered with a polarizer.

In a second aspect, a method for manufacturing a first display module is provided, comprising the following steps: fixing at least three first light-emitting chips into the same pixel unit of a first substrate so as to make centers of at least three first light-emitting chips not collinear, projections of at least three first light-emitting chips along a first direction at least partially overlap, and projections of at least three first light-emitting chips along a second direction at least partially overlap, wherein the first direction is perpendicular to the second direction; covering a surface of the first substrate with exposure dissolving glue so as to make the exposure dissolving glue cover the first light-emitting chips; and lighting up the first light-emitting chips, and dissolving the exposure dissolving glue at the corresponding positions of the first light-emitting chips.

In some embodiments, the exposure dissolving glue forms first grooves on the surfaces of the first light-emitting chips; after dissolving the exposure dissolving glue at the corresponding positions of the first light-emitting chips, further comprising the following step: filling first colloids into the grooves, wherein colors of the first colloids are basically the same as that of the exposure dissolving glue.

In some embodiments, after filling the first colloids into the grooves, further comprising the following steps: covering the surfaces of the first colloids and the exposure-dissolving glue with optical glue; and covering the surface of the optical glue (6) with a polarizer (7).

In a third aspect, a method for manufacturing a second display module is provided, comprising the following steps: fixing at least three second light-emitting chips to the same pixel unit of a second substrate so as to make the second light-emitting chips in the same pixel unit and the first light-emitting chips of the above-mentioned first display module mirror images of each other; covering a surface of the second substrate with exposure dissolving glue so as to make the exposure dissolving glue cover the second light-emitting chips; and aligning the first display module according to the second aspect with the second substrate so that the first light-emitting chips face the second light-emitting chips; and lighting up the first light-emitting chips, and dissolving the exposure dissolving glue at the corresponding positions of the second light-emitting chips.

In some embodiments, the exposure dissolving glue forms second grooves on the surfaces of the second light-emitting chips; after dissolving the exposure dissolving glue at the corresponding positions of the second light-emitting chips, further comprising the following step: filling second colloids into the second grooves, wherein colors of the second colloids are basically the same as that of the exposure dissolving glue.

The beneficial effects of the technical solution provided in the present invention comprise:

The embodiments of the present invention provide a display module and a method for manufacturing the display module, since the centers of the light-emitting chips are not collinear, that is, a plurality of light-emitting chips are not arranged in a straight line, and the projections of the plurality of the light-emitting chips partially overlap in at least two directions, the positions of the plurality of the light-emitting chips are more concentrated, which can effectively improve the light emission effect of the light-emitting chips.

IV. BRIEF DESCRIPTION OF THE DRAWINGS

In order to better illustrate the technical solution in the embodiments of the present application, the following will briefly introduce the drawings needed in the description of the embodiments, and it is obvious that the drawings in the following description are only a part of embodiments of the present application, for those of ordinary skill in the art, other drawings may also be obtained based on these drawings without any inventive effort.

1—substrate; 11—pixel unit; 111—common A—pole pad; 112-B—pole pad; 113—common pin; 114—independent pin; 115—through-hole; 116—wire;

2—light-emitting chip; 3—exposure dissolving glue; 4—groove; 5—colloid; 6—optical glue; 7—polarizer;

8—the second substrate; 9—the second light-emitting chip; 91—the second groove.

V. DETAILED DESCRIPTION OF THE EMBODIMENTS

In order to make the purpose, technical solutions and advantages of the embodiments of the present invention clearer, the technical solutions in the embodiments of the present invention will be described clearly and completely in combination with the drawings in the embodiments of the present invention. Obviously, the described embodiments are only a part of the embodiments of the present invention, not all of the embodiments. Based on the embodiments in the present invention, all other embodiments obtained by a person of ordinary skill in the art without inventive efforts shall fall within the protection scope of the present invention.

The embodiments of the present invention provide a display module and a method for manufacturing the display module, which can solve the problem in the related art that chips are placed in scattered positions and light emission angles are also greatly different, resulting in impure display effects of the module.

Figure 1:
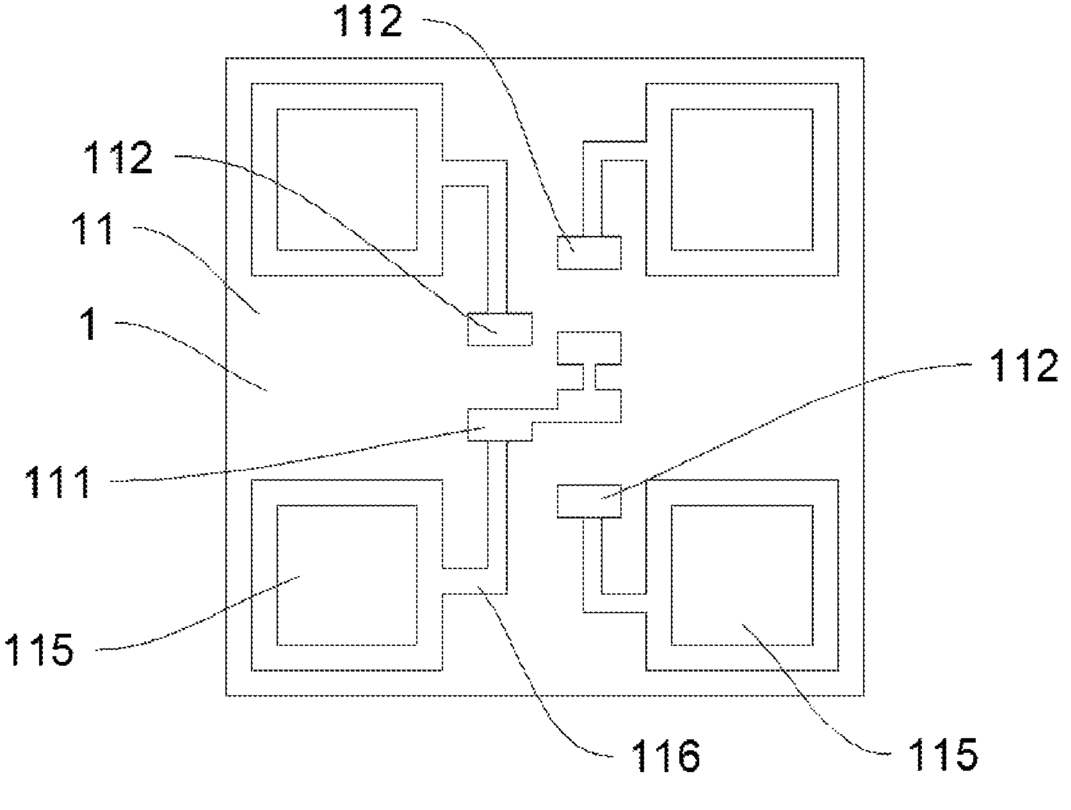
FIG. 1 is a structural diagram of a front side of a substrate of a display module in the embodiment of the present invention.
Figure 2:
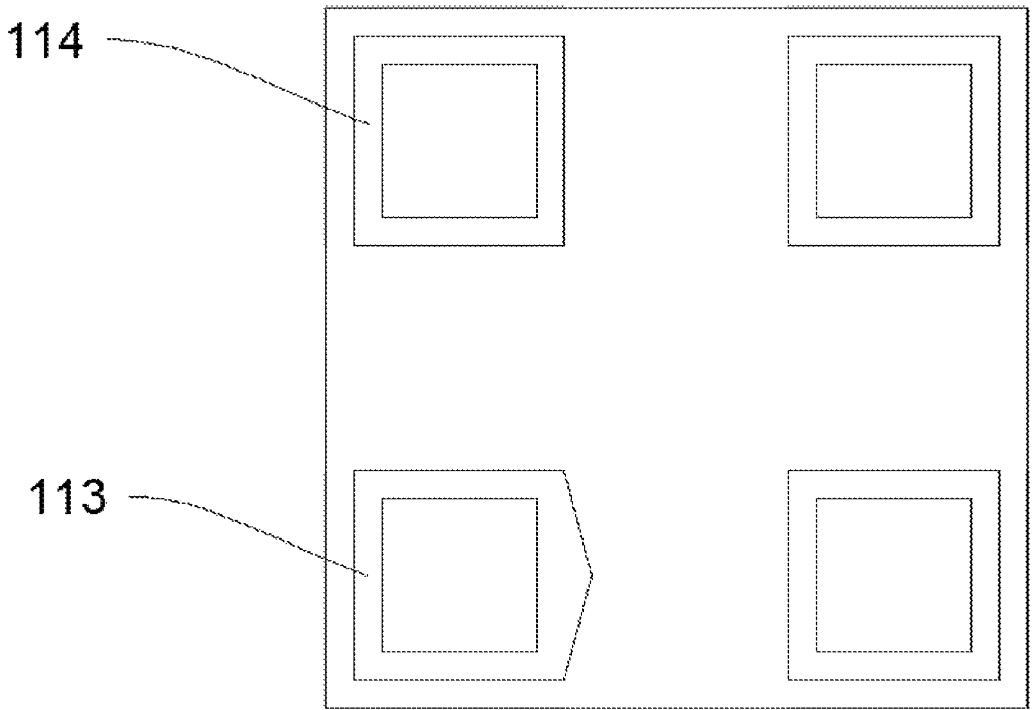
FIG. 2 is a structural diagram of a back side of a substrate of a display module in the embodiment of the present invention.
Figure 3:
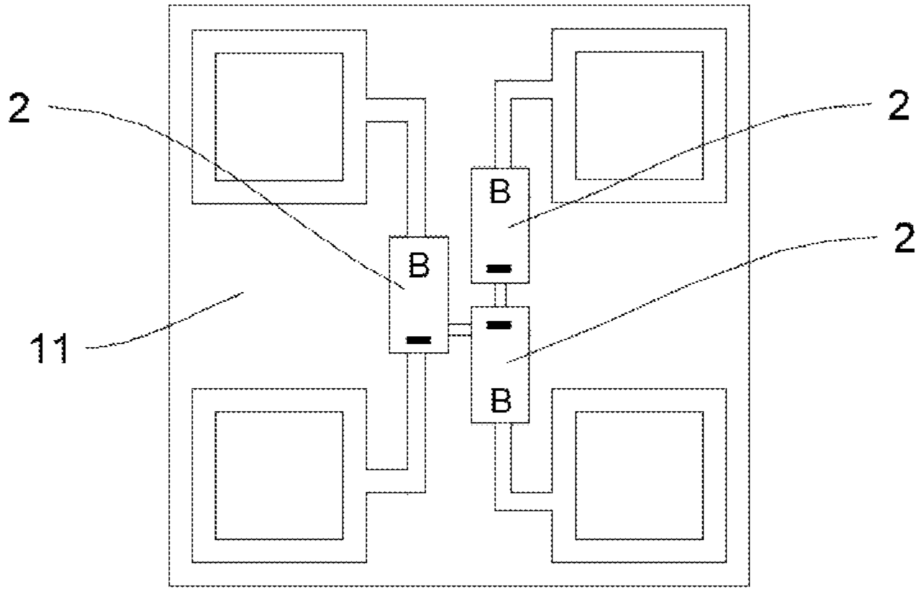
FIG. 3 is a structural diagram of a pixel unit of a display module in the embodiment of the present invention.

As shown in FIGS. 1 to 3, the embodiment of the present invention provides a display module, which can comprise a substrate 1, a plurality of pixel units 11 are arrayed on the substrate 1, each of the pixel units 11 can be used as a single lamp bead (a single lamp bead is shown in FIG. 3), each of the pixel units 11 is provided with at least three light-emitting chips 2, and centers of at least three light-emitting chips 2 are not collinear, that is to say, each of the pixel units 11 can be provided with three light-emitting chips 2 or four light-emitting chips 2 according to needs, and light-emitting colors of each of the light-emitting chips 2 can be the same or different. For example, the colors of a plurality of light-emitting chips 2 can all be blue light chips or can be one red light chip, one green light chip and one blue light chip. FIG. 3 only shows one way of placing the light-emitting chips 2 in the pixel unit 11. In practice, the placement positions of the light-emitting chips 2 can be interchanged at will. The fact that the centers of at least three light-emitting chips 2 are not collinear can be understood as the center of one light-emitting chip of at least three light-emitting chips 2 is not collinear with the centers of the remaining light-emitting chips 2, or the centers of two light-emitting chips 2 of at least three light-emitting chips are not collinear with the centers of the remaining light-emitting chips 2.

Projections of at least three light-emitting chips 2 along a first direction at least partially overlap, which can be understood as the projections of two light-emitting chips 2 along the first direction partially overlap, or the projections of three light-emitting chips 2 along the first direction partially overlap, or the projections of a greater number of light-emitting chips 2 in the first direction partially overlap. Projections of at least three light-emitting chips 2 along a second direction at least partially overlap. The understanding herein can be basically the same as the above-mentioned understanding of the projections in the first direction, wherein the first direction is perpendicular to the second direction, that is, the projections of at least three light-emitting chips 2 at least partially overlap in at least two directions. With such an arrangement, the present invention can arrange the central positions of the plurality of the light-emitting chips 2 in a more concentrated manner compared to the generally horizontal or vertical in-line arrangement, and the light-mixing distance of the plurality of the light-emitting chips 2 is closer, so that the plurality of the light-emitting chips 2 in the same pixel unit 11 can be concentrated into one large chip, which can effectively improve the light emission effect of the light-emitting chips 2 and make the light emission more uniform.

Preferably, the substrate 1 can be a PCB or a chip on board (COB).

Figure 4:
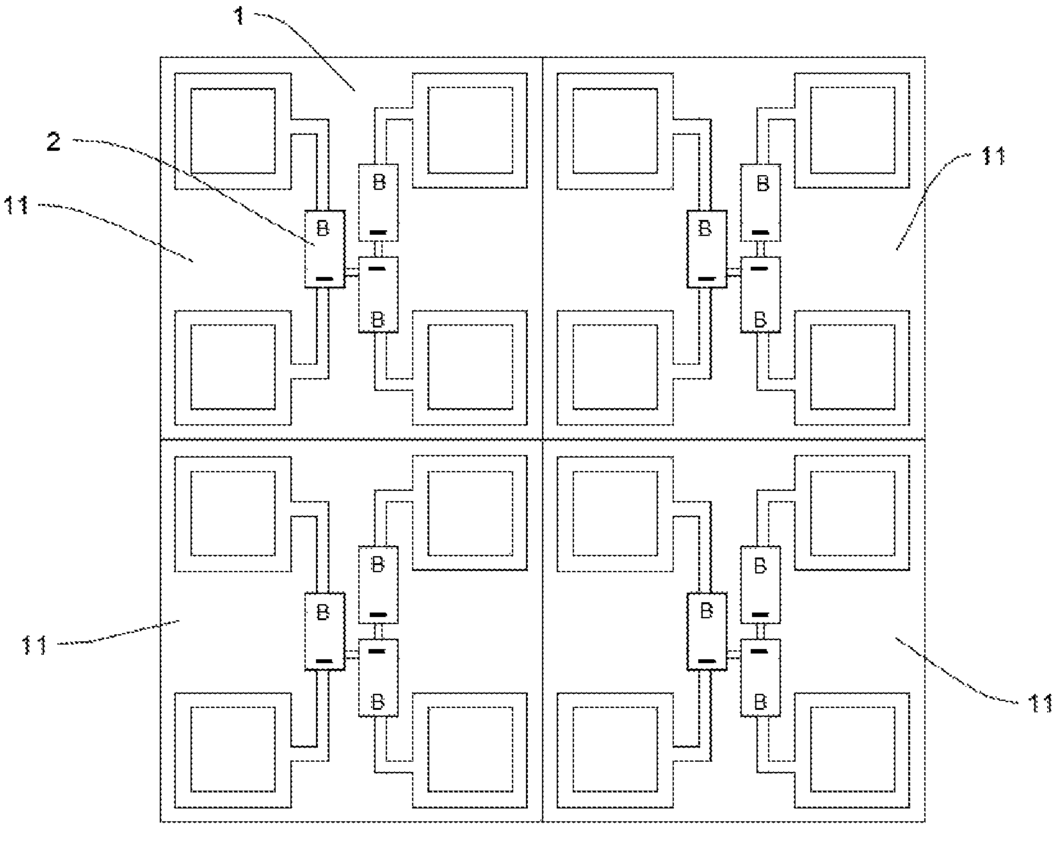
FIG. 4 is a structural diagram of a plurality of pixel units of a display module in the embodiment of the present invention.

As shown in FIG. 3 and FIG. 4, in some embodiments, each of the pixel units 11 can be provided with three light-emitting chips 2, and lines connecting the centers of the three light-emitting chips 2 form an acute-angled triangle. In this embodiment, three light-emitting chips 2 are taken as an example. When three light-emitting chips 2 are provided, setting the connection between the centers of the three light-emitting chips 2 as an acute-angled triangle can further shorten the distance between the centers of each of the light-emitting chips 2, making the light-emitting chips 2 more concentrated. Each of the light-emitting chips 2 can be arranged parallel to each other or tilted to each other, for example, one of the light-emitting chips 2 can be placed along the first direction, and the other two light-emitting chips 2 can be arranged at an angle, so that the other two light-emitting chips 2 are arranged at an angle relative to the first light-emitting chip 2, or the centers of the three light-emitting chips 2 can form an acute-angled triangle.

As shown in FIG. 1 and FIG. 2, in some optional embodiments, one side of the substrate 1 is provided with at least one common A-pole pad 111 and a plurality of B-pole pads 112 in each of the pixel units 11. The plurality of the B-pole pads 112 can be independent of each other, the A-poles of at least three light-emitting chips 2 are electrically connected to the common A-pole pad 111, and the B-pole of each of the light-emitting chips 2 is electrically connected to the corresponding B-pole pad 112. The polarities of the A-pole and the B-pole are opposite, that is, the A-pole can be positive or negative, and when the A-pole is positive, the B-pole is negative. The other side of the substrate 1 can be provided with a common pin 113 in each of the pixel units 11, and the common pin 113 is electrically connected to the common A-pole pad 111. The substrate 1 can be provided with a through-hole 115 penetrating from the front to the back, and both the common A-pole pad 111 and the B-pole pad 112 can be electrically connected to the corresponding through-hole 115 through corresponding wires 116. The common A-pole pad 111 can be electrically connected to the common pin 113 on the back through the corresponding through-hole 115, an independent pin 114 can also be provided on the back, and the B-pole pad 112 can be electrically connected to the corresponding independent pin 114 on the back through the corresponding through-hole 115. In this embodiment, the common A-pole pad 111 and the common pin 113 are provided in each of the pixel units 11 so as to achieve a common cathode or a common anode, thereby simplifying the wiring of the pins in each pf the pixel units 11, which is beneficial to simplifying the manufacturing steps of the display module and reducing costs.

Figure 5:
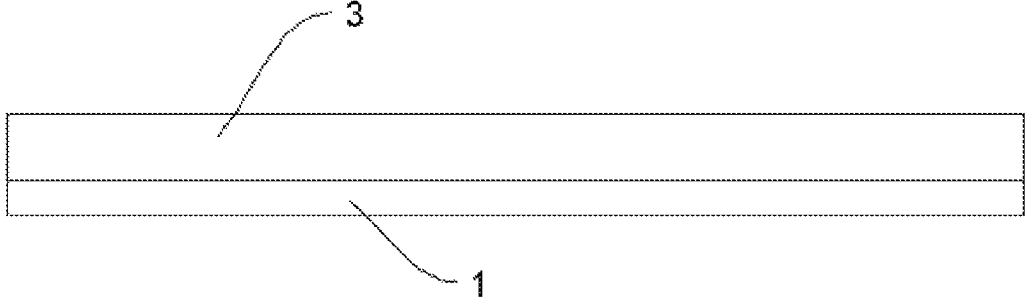
FIG. 5 is a structural diagram of a substrate covered with exposure dissolving glue in the embodiment of the present invention.
Figure 6:
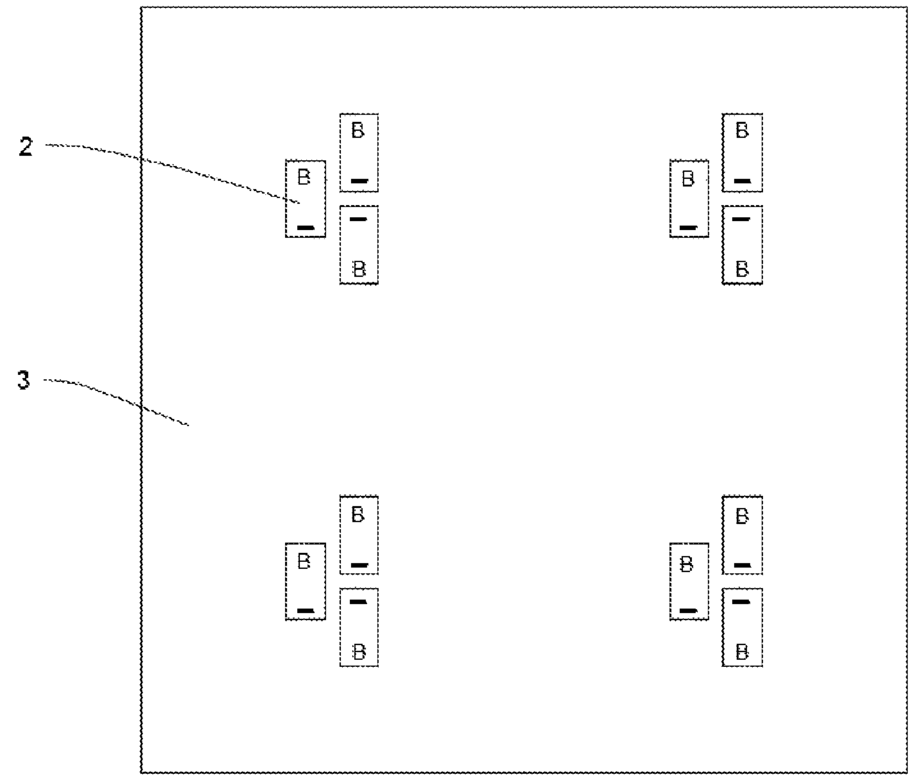
FIG. 6 is a top view of grooves formed on light-emitting chips in the embodiment of the present invention.
Figure 7:
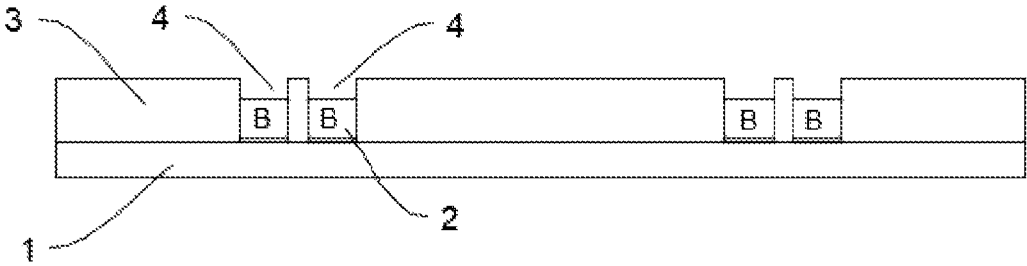
FIG. 7 is a side view of a substrate after exposure and dissolution in the embodiment of the present invention.

As shown in FIGS. 5 to 7, in some embodiments, a surface of the substrate 1 is covered with exposure dissolving glue 3, the exposure dissolving glue 3 forms grooves 4 on surfaces of the light-emitting chips 2, that is, the upper surface of the exposure dissolving glue 3 are higher than the upper surfaces of the light-emitting chips 2, so that the grooves 4 are formed on the upper surfaces of the light-emitting chips 2, and each groove 4 is surrounded by the exposure dissolving glue 3; and each groove 4 can be filled with colloid 5, and a color of the colloid 5 is basically the same as that of the exposure dissolving glue 3. The colloid 5 can contain a certain amount of black powder, and the black powder can be carbon powder or manganese dioxide powder. Filling the colloid 5 can make the ink color of the upper surface of the exposure dissolving glue 3 and the upper surfaces of the light-emitting chips 2 look as consistent as possible after the light-emitting chips 2 are extinguished.

Of course, in other embodiments, the surfaces of the light-emitting chips 2 can also be arranged flush with the surface of the exposure dissolving glue 3.

Figure 8:
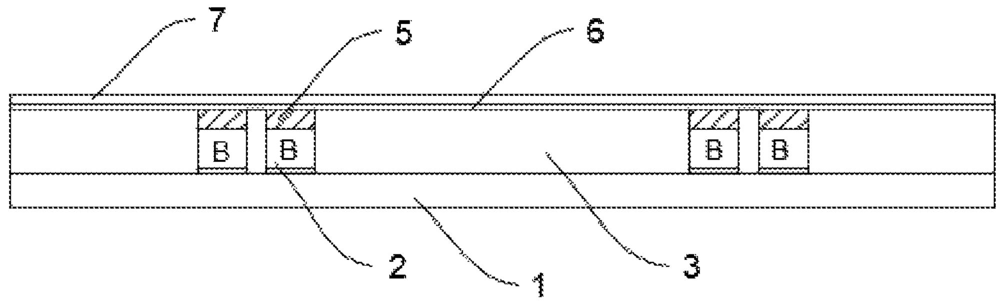
FIG. 8 is a structural diagram of a substrate covered with optical glue and polarizer in the embodiment of the present invention.
Figure 9:
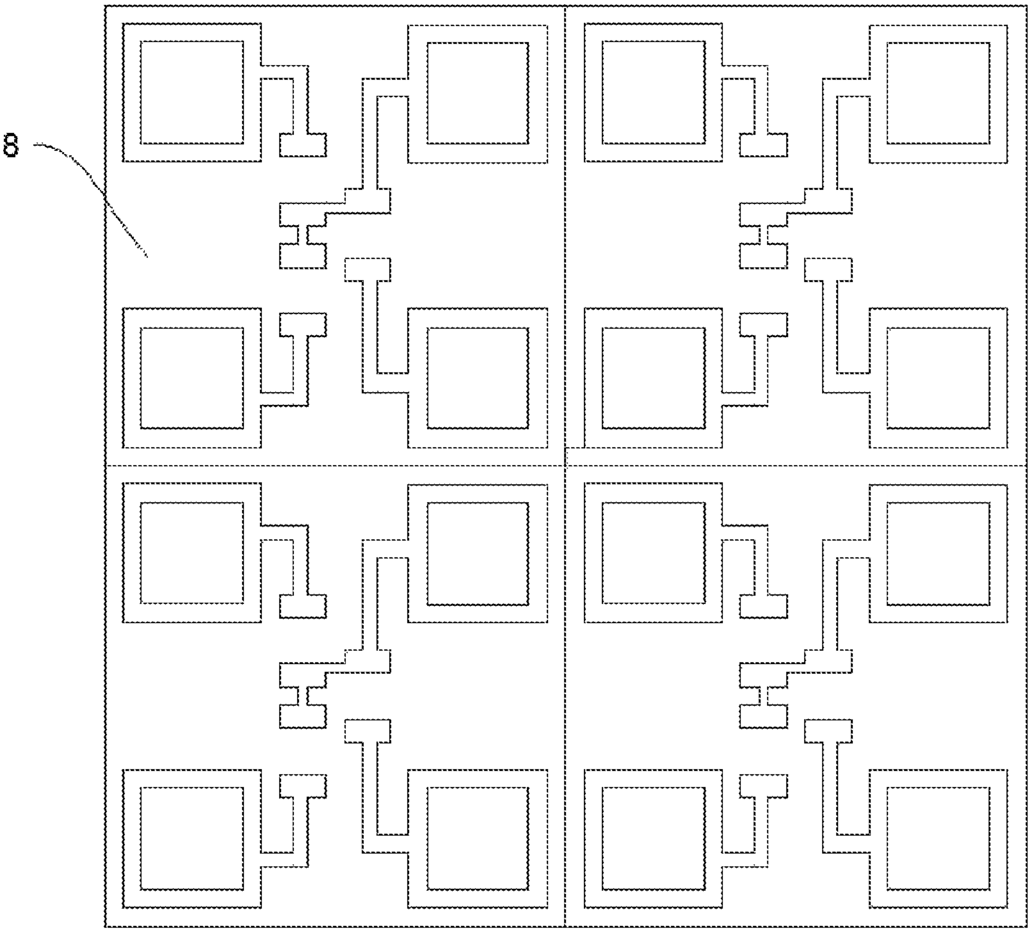
FIG. 9 is a structural diagram of the second substrate in the embodiment of the present invention.
Figure 10:
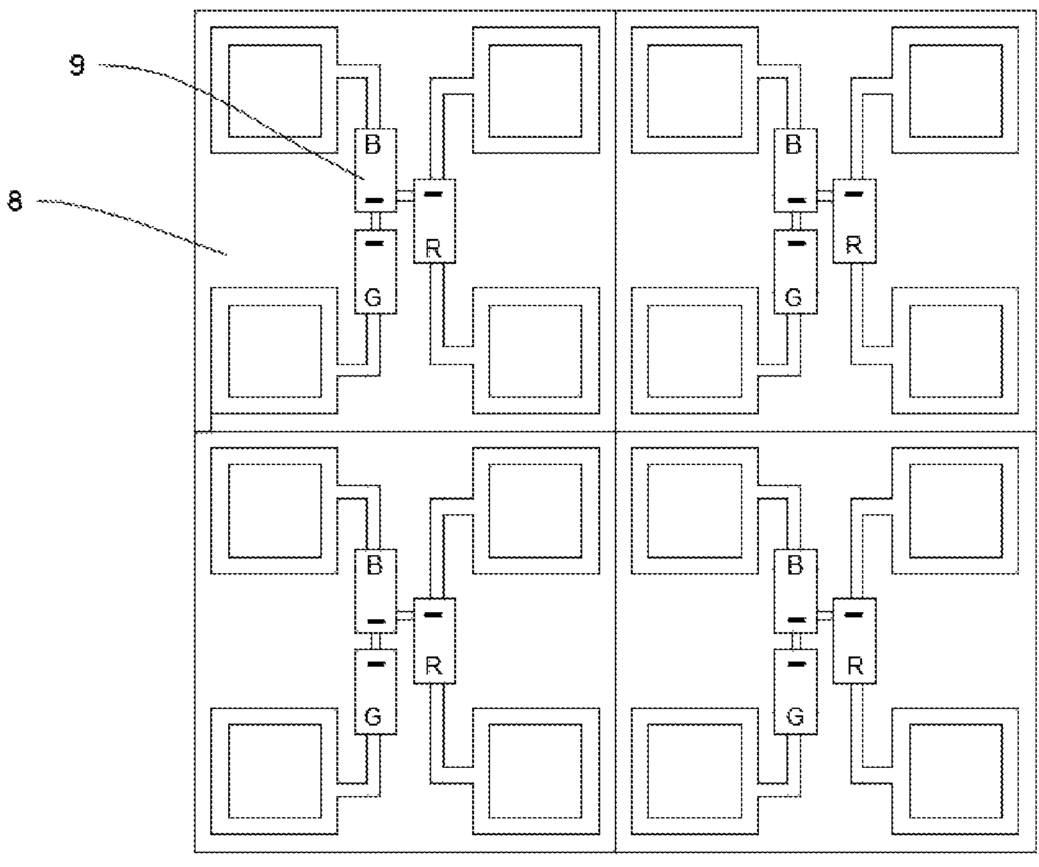
FIG. 10 is a structural diagram of the second display module in the embodiment of the present invention.
Figure 11:
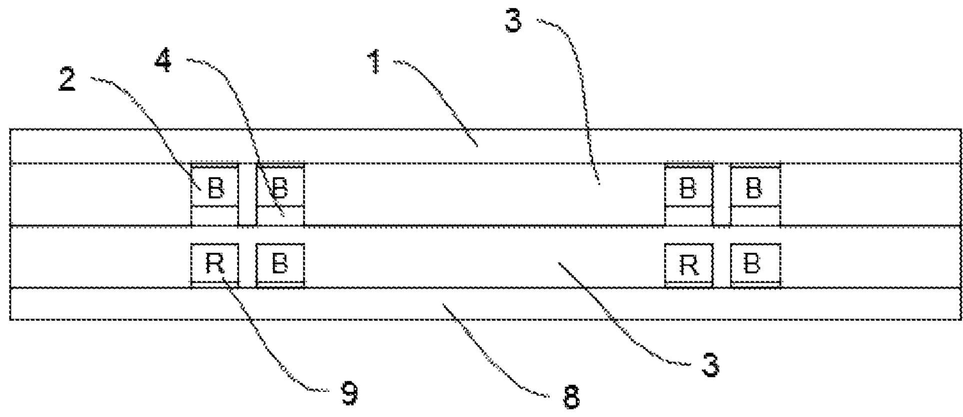
FIG. 11 is a structural diagram of using the first display module to dissolve exposure dissolving glue of the second display module in the embodiment of the present invention.

As shown in FIG. 8, preferably, in order to ensure better ink color effects, the surfaces of the exposure dissolving glue 3 and the colloids 5 can be covered with optical glue 6, such as OCA optical glue 6. The optical glue 6 can play a bonding role, and can transmit light. The surface of the optical glue 6 covers a polarizer 7, and when a layer of the polarizer 7 is attached, the function of waterproofing and protecting the internal colloids 5 can be provided.

The embodiment of the present invention also provides a method for manufacturing a first display module, the first display module in this embodiment can be the above-mentioned display module, and the manufacturing method can comprise the following steps.

S11: At least three first light-emitting chips 2 are fixed into the same pixel unit 11 of a first substrate 1 so as to make centers of at least three first light-emitting chips 2 not collinear, projections of at least three first light-emitting chips 2 along a first direction at least partially overlap, and projections of at least three first light-emitting chips 2 along a second direction at least partially overlap, wherein the first direction is perpendicular to the second direction. Such an arrangement makes the positions of the first light-emitting chips 2 in the same pixel unit 11 more concentrated, thereby improving the light emission effect and uniformity of the first light-emitting chips 2.

S12: The surface of the first substrate 1 is covered with exposure dissolving glue 3 so as to make the exposure dissolving glue 3 cover the first light-emitting chips 2. The exposure dissolving glue 3 can be covered on the first substrate 1 through a printer, a glue dispenser or a 3D printing device.

S13: The first light-emitting chips 2 are lighted by energizing, and the exposure dissolving glue 3 at the corresponding positions of the first light-emitting chips 2 is dissolved. The exposure dissolving glue 3 covers the surface of the substrate 1 to form an ink color on the surface of the substrate 1 and protect the substrate 1.

Furthermore, as the spacing of pixels and the size of chips in display module decrease, the distance between chips continues to shrink, which increases the difficulty of forming ink color coverage in the display module, and the accuracy requirements for the alignment of the printed ink color layer are also higher, causing the process cost to skyrocket.

In order to make the ink color of the black matrix area of the display module after the light-emitting chips 2 are extinguished and the areas of the light-emitting chips 2 as consistent as possible, in the related art, it is proposed to adopt a molding packaging process to integrally form a black packaging layer on the upper surface of the light-emitting chips 2 array and the black matrix, or to adopt an underfill method to make the ink color of the lamp beads black. However, the molding packaging process and underfill process are difficult, inefficient, and costly.

In this embodiment, after the exposure dissolving glue 3 is dissolved on the surfaces of the first light-emitting chips 2, the first grooves 4 can be formed on the surfaces of the first light-emitting chips 2, each first groove 4 can be surrounded by the exposure dissolving glue 3 so as to expose the first light-emitting chip 2, and the depth of each first groove 4 can be between 15 um and 20 um. After the exposure dissolving glue 3 is dissolved at the corresponding positions of the first light-emitting chips 2, it can further comprise the step of filling first colloids 5 into the grooves 4, and the colors of the first colloids 5 are basically the same as that of the exposure dissolving glue 3, so that after the first light-emitting chips 2 are extinguished, the ink color of the surface of the exposure dissolving glue 3 and the surfaces of the first light-emitting chips 2 look as consistent as possible. The areas of the first light-emitting chips 2 and the area of the black matrix can be accurately distinguished through the exposure dissolving glue 3, and then the positions of the first light-emitting chips 2 can be dissolved to form the first grooves 4 and filled with ink.

Preferably, in order to ensure better ink color effects, after the first colloids 5 are filled into the grooves 4, it can also comprise the step of covering the surfaces of the first colloids 5 and the exposure dissolving glue 3 with optical glue 6, and the optical glue 6 can cover the surfaces of the first colloids 5 and the exposure dissolving glue 3 through a tin brushing machine; and then the surface of the optical glue 6 is covered with a polarizer 7. The polarizer 7 can be pasted on the surface of the optical glue 6 through a laminating machine, and a layer of the polarizer 7 can play the role of waterproofing and protecting the internal colloids 5.

Further, FIG. 4 shows the first display module before cutting. The first display module is arranged with a plurality of pixel areas. When the first substrate 1 is a lamp bead substrate 1, each of the pixel areas can be cut into a single lamp bead through cutting lines in the later stage, and when the first substrate 1 is a COB, there is no need to cut the substrate 1 through cutting lines in the later stage. When the first substrate 1 is COB, the blue light chips can be transferred to the first substrate 1 through chip transfer equipment such as a die bonder, and the first substrate 1 can be connected to an external power supply and lighted by energizing.

As shown in FIGS. 9 to 13, the embodiment of the present invention further provides a method for manufacturing a second display module, which can comprise the following steps:

S21: At least three second light-emitting chips 9 are fixed to the same pixel unit of a second substrate 8 so as to make the second light-emitting chips 9 in the same pixel unit and the first light-emitting chips 2 of the above-mentioned first display module mirror images of each other to meet the subsequent alignment of the substrate 1.

S22: A surface of the second substrate 8 is covered with exposure dissolving glue 3 so as to make the exposure dissolving glue 3 cover the second light-emitting chips 9.

S23: The above-mentioned first display module is aligned with the second substrate 8 through a laminating machine so that the first light-emitting chips 2 face the second light-emitting chips 9. The first display module can be the first display module manufactured in any of the above embodiments. In this embodiment, it is preferable to adopt the first display module that has not been filled with the first colloids 5 as a common template that can be reused during subsequent exposure and dissolution. The alignment herein can be understood as placing the front side of the first substrate 1 facing the front side of the second substrate 8. The exposure dissolving glue 3 on the first substrate 1 can be closely aligned with the exposure dissolving glue 3 on the second substrate 8, or there can be a certain gap between the exposure soluble glue 3 on the first substrate 1 and the exposure dissolving glue 3 on the second substrate 8. After the alignment, the first light-emitting chips 2 correspond to the second light-emitting chips 9 one by one.

S24: The first light-emitting chips 2 are lighted, and the exposure dissolving glue 3 at the corresponding positions of the second light-emitting chips 9 is dissolved. That is, when the second display module is exposed and dissolved, it is not necessary to light up the second light-emitting chips 9. The first light-emitting chips 2 can be lighted again to expose and dissolve the corresponding exposure dissolving glue 3 at the second light-emitting chips 9. In this embodiment, the double substrate 1 (that is, the first substrate 1 and the second substrate 8) is mirror-aligned, so that the second light-emitting chips 9 can perform exposure and dissolution even without power supply, which solves the problem of poor exposure and dissolving effect of the exposure dissolving glue 3. This exposure and dissolution method is not only suitable for the production of COB, but also can be applied to the production of lamp beads, solving the problem of making black packaging layer for traditional lamp beads and realizing the packaging production of flip-chip lamp beads.

Figure 12:
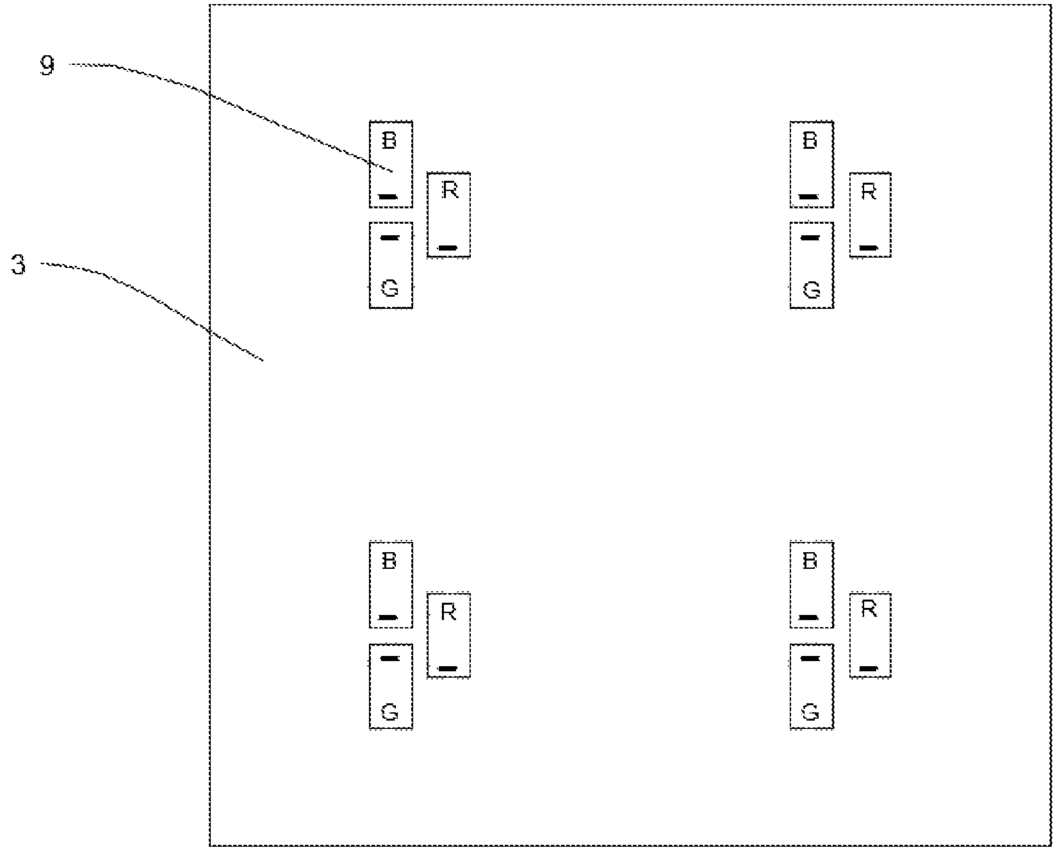
FIG. 12 is a top view of the second grooves formed on the second light-emitting chips in the embodiment of the present invention.
Figure 13:
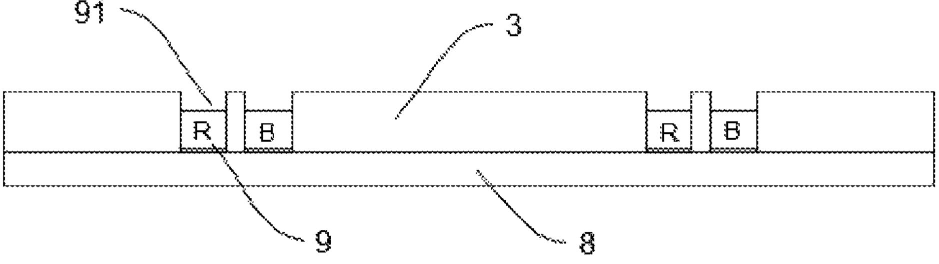
FIG. 13 is a side view of the second substrate after exposure and dissolution in the embodiment of the present invention.
Figure 14:
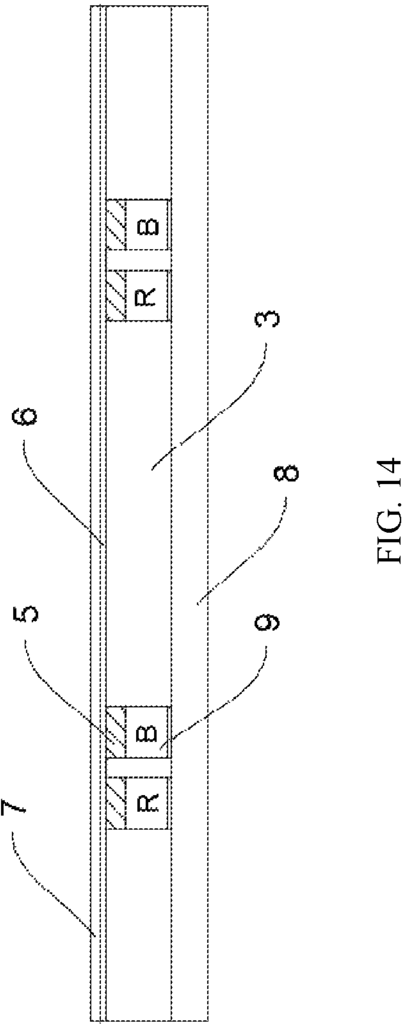
FIG. 14 is a structural diagram of another second display module in the embodiment of the present invention.

Further, as shown in FIGS. 12 to 14, the exposure dissolving glue 3 can form second grooves 91 on the surfaces of the second light-emitting chips 9, and the depth of each second groove 91 can be between 15 um and 20 um. After the exposure dissolving glue 3 at the corresponding positions of the second light-emitting chips 9 is dissolved, it can also comprise the step of filling second colloids 5 into the second grooves 91, and colors of the second colloids 5 are basically the same as that of the exposure dissolving glue 3.

On the basis of the above technical solution, the surfaces of the second colloids 5 and the exposure dissolving glue 3 of the second substrate 8 can also be covered with optical glue 6 and a polarizer 7.

In the description of the present invention, it should be noted that the orientation or positional relationship indicated by the terms "upper", "lower", etc. are based on the orientation or positional relationship shown in the drawings, which is only for the convenience of describing the present invention and simplifying the description, instead of indicating or implying that the pointed device or element must have a specific orientation, be configured and operated in a specific orientation, therefore it may not be understood as a limitation of the present invention. Unless otherwise clearly specified and limited, the terms "installation", "connected" and "connection" should be understood in a broad sense. For example, it can be a fixed connection, a detachable connection, or an integral connection; further can be a mechanical connection, or an electrical connection; further can be directly connected, or indirectly connected through an intermediate medium, or can be the internal communication between two components. For those of ordinary skill in the art, the specific meanings of the above-mentioned terms in the present application may be understood according to specific circumstances.

It should be noted that relational terms such as "first" and "second" are only for distinguishing one entity or operation from another entity or operation in the present invention, and do not necessarily require or imply any such actual relationship or order between these entities or operations. Moreover, the terms "include", "comprise" or any other variants thereof are intended to cover non-exclusive inclusion, so that a process, method, article or device comprising a series of elements not only comprises those elements, but also comprises those that are not explicitly listed, or further comprises elements inherent to the process, method, article, or device. If there are no more restrictions, the elements defined by the sentence "comprising a . . . " does not exclude the existence of other same elements in the process, method, article, or device comprising the elements.

The above-mentioned are only the embodiments of the present invention, so that those skilled in the art may understand or implement the present invention. For those skilled in the art, various modifications to these embodiments will be obvious, and the general principles defined herein may be implemented in other embodiments without departing from the spirit or scope of the present invention. Therefore, the present invention will not be limited to the embodiments shown in this document, but will be subject to the widest scope consistent with the principles and novel features applied herein.

The invention claimed is:

1. A display module comprising:

a substrate (1), a plurality of pixel units (11) are arrayed on the substrate (1), and each of the pixel units (11) is provided with at least three light-emitting chips (2), and centers of the at least three light-emitting chips (2) are not collinear; and projections of the at least three light-emitting chips (2) along a first direction at least partially overlap, and projections of the at least three light-emitting chips (2) along a second direction at least partially overlap, wherein the first direction is perpendicular to the second direction, and wherein one side of the substrate (1) is provided with at least one common A-pole pad (111) and a plurality of B-pole pads (112) in each of the pixel units (11), the A-poles of the at least three light-emitting chips (2) are electrically connected to the common A-pole pad (111), and the B-poles of the light-emitting chips (2) are respectively electrically connected to the corresponding B-pole pads (112), wherein polarities of the A-poles and the B-poles are opposite; and another side of the substrate (1) is provided with a common pin (113) in each of the pixel units (11), and the common pin (113) is electrically connected to the common A-pole pad (111).

2. The display module according to claim 1, wherein each of the pixel units (11) is provided with three light-emitting chips (2), and lines connecting the centers of the three light-emitting chips (2) form an acute-angled triangle.

3. The display module according to claim 1, wherein a surface of the substrate (1) is covered with exposure dissolving glue (3), the exposure dissolving glue (3) forms grooves (4) on surfaces of the light-emitting chips (2), the grooves (4) are filled with colloids (5), and colors of the colloids (5) are basically the same as that of the exposure dissolving glue (3).

4. The display module according to claim 3, wherein the surfaces of the exposure dissolving glue (3) and the colloids (5) are covered with an optical glue (6), and the surface of the optical glue (6) is covered with a polarizer (7).

5. A method for manufacturing a first display module, the method comprising:

fixing at least three first light-emitting chips (2) into one pixel unit (11) of a first substrate (1) so as to make centers of the at least three first light-emitting chips (2) not collinear, projections of the at least three first light-emitting chips (2) along a first direction at least partially overlap, and projections of the at least three first light-emitting chips (2) along a second direction at least partially overlap, wherein the first direction is perpendicular to the second direction;

covering a surface of the first substrate (1) with an exposure dissolving glue (3) so as to make the exposure dissolving glue (3) cover the first light-emitting chips (2); and lighting up the first light-emitting chips (2), and dissolving the exposure dissolving glue (3) at corresponding positions of the first light-emitting chips (2);

wherein the exposure dissolving glue (3) forms first grooves (4) on the surfaces of the first light-emitting chips (2);

after dissolving the exposure dissolving glue (3) at the corresponding positions of the first light-emitting chips (2), the method further comprising:

filling first colloids (5) into the grooves (4), wherein colors of the first colloids (5) are basically the same as that of the exposure dissolving glue (3);

wherein after filling the first colloids (5) into the grooves (4), the method further comprising:

covering the surfaces of the first colloids (5) and the exposure-dissolving glue (3) with optical glue (6); and covering the surface of the optical glue (6) with a polarizer (7).

6. A method for manufacturing a second display module to a first display module, the method comprising:

fixing at least three first light-emitting chips (2) into one pixel unit (11) of a first substrate (1) so as to make centers of at least three first light-emitting chips (2) not collinear, projections of at least three first light-emitting chips (2) along a first direction at least partially overlap, and projections of at least three first light-emitting chips (2) along a second direction at least partially overlap, wherein the first direction is perpendicular to the second direction;

covering a surface of the first substrate (1) with exposure dissolving glue (3) so as to make the exposure dissolving glue (3) cover the first light-emitting chips (2); and lighting up the first light-emitting chips (2), and dissolving the exposure dissolving glue (3) at corresponding positions of the first light-emitting chips (2);

fixing at least three second light-emitting chips (9) to one pixel unit (11) of a second substrate (8) so as to make the second light-emitting chips (9) in the same pixel unit (11) and the first light-emitting chips (2) of the first display module mirror images of each other;

covering a surface of the second substrate (8) with exposure dissolving glue (3) so as to make the exposure dissolving glue (3) cover the second light-emitting chips (9);

aligning the first display module with the second substrate (8) so that the first light-emitting chips (2) face the second light-emitting chips (9); and lighting up the first light-emitting chips (2), and dissolving the exposure dissolving glue (3) at corresponding positions of the second light-emitting chips (9).

7. The manufacturing method according to claim 6, wherein the exposure dissolving glue (3) forms second grooves (91) on the surfaces of the second light-emitting chips (9);

after dissolving the exposure dissolving glue (3) at the corresponding positions of the second light-emitting chips (9), the method further comprising:

filling second colloids (5) into the second grooves (91), wherein colors of the second colloids (5) are basically the same as that of the exposure dissolving glue (3).

* * * * *